(12) United States Patent
Huffman et al.

(10) Patent No.: US 6,775,174 B2
(45) Date of Patent: Aug. 10, 2004

(54) MEMORY ARCHITECTURE FOR MICROMIRROR CELL

(75) Inventors: James D. Huffman, Richardson, TX (US); Larry J. Hornbeck, Van Alstyne, TX (US); Richard L. Knipe, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/034,896

(22) Filed: Dec. 28, 2001

(65) Prior Publication Data

US 2002/0085437 A1 Jul. 4, 2002

Related U.S. Application Data

(60) Provisional application No. 60/258,607, filed on Dec. 28, 2000.

(51) Int. Cl.[7] ............................................... G11C 11/24
(52) U.S. Cl. ...................... 365/149; 365/237; 365/106
(58) Field of Search ............................... 365/149, 237, 365/106

(56) References Cited

U.S. PATENT DOCUMENTS

| | | | |
|---|---|---|---|
| 5,142,405 A | | 8/1992 | Hornbeck |
| 5,452,024 A | * | 9/1995 | Sampsell .................... 348/755 |
| 5,670,977 A | * | 9/1997 | Chiu et al. .................. 345/755 |
| 6,115,083 A | * | 9/2000 | Doherty et al. ............. 348/771 |
| 6,266,178 B1 | * | 7/2001 | Huffman .................... 359/291 |

* cited by examiner

*Primary Examiner*—Connie C. Yoha
(74) *Attorney, Agent, or Firm*—Charles A. Brill; Wade James Brady, III; Frederick J. Telecky, Jr.

(57) ABSTRACT

A one transistor one capacitor micromirror with DRAM memory cell built around a large polysilicon-to-substrate capacitor which is not susceptible to recombination of photo-generated carriers caused by illumination in the projector. This large polysilicon-to-substrate capacitor overshadows the much smaller inherent parallel depletion capacitance which is sensitive to light. The device is further 100% shielded from exposed light by metal layers and the address node is located under the center of the micromirror mirror to obtain maximum shielding of light for the smaller, light sensitive, depletion portion of the capacitance. As a result the micromirror of this invention can adequately hold the cell charge in excess of the device load time of 300 μSec even in extremely high brightness projector applications. This invention also provides a feature which automatically forces micromirror mirrors located over bad CMOS memory cell to the dark state, which is much less objectionable in most applications, thereby improving the overall effective processing yield.

15 Claims, 7 Drawing Sheets

MEMORY ARCHITECTURE FOR MICROMIRROR CELL

CROSS-REFERENCE TO RELATED APPLICATIONS

This application claims priority under 35 USC§119(e)(1) of provisional application No. 60/258,607 file Dec. 28, 2000.

The following patent is hereby incorporated herein by reference: U.S. Pat. No. 5,142,405, filed Jun. 29, 1990, issued Aug. 25, 1992, entitled Bistable DMD Addressing Circuit And Method.

BACKGROUND OF THE INVENTION

1. Field of the Invention

The invention relates to micromirror spatial light modulators and more specifically to a new one transistor, one capacitor memory cell for these devices.

2. Description of the Related Art

Figure 1:
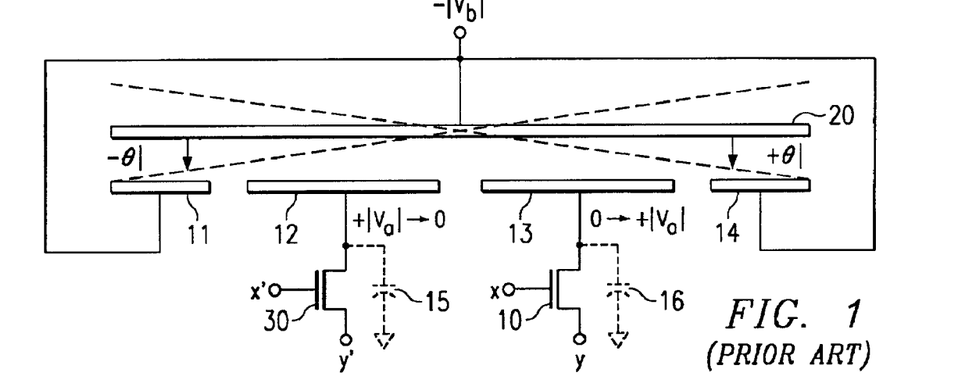
FIG. 1 is a schematic diagram of a 2T prior art DRAM cell and micromirror element.

Early micromirror spatial light modulators, such as the DMD™ from Texas Instruments Incorporated, used two transistor (2T) DRAM underlying memory cells as shown in FIG. 1. These were bi-directional devices where the reflective mirror 20 (known as the beam) rotated ±10°. The device was comprised of the beam 20, two address electrodes 12 and 13, two address transistors 10 and 30, and two landing pads 11 and 14. When data was read into these devices, it was stored on substrate depletion capacitors 15 and 16 located at the address nodes of transistors 30 and 10, respectively. In order to keep the address voltage applied to the address electrodes 12 and 13 at reasonable levels (0 to 5V), the beam 20 was biased at $-|V_b|$, as shown. With a beam bias of −16 volts, the micromirror would operate in the bistable mode with 0V and +5V address voltages. In operation, the electrode at 0V would have a potential between the beam and electrode of 16−0=16V (magnitude only) while the electrode at +5V would have a potential of 16−5=11V, so the beam would tilt towards the 0V electrode side. Notice that in these devices there are landing pads 11 and 14 at the same electrical potential as the beam 20 on which the beam 20 touches down and lands. The geometry of the device is such that when the mirror lands it is tilted ±10°.

The problem with these early 2T DRAM micromirror spatial modulators, however, was that the substrate storage capacitors 15 and 16 were extremely sensitive to light generated carriers in the substrate which would recombine with the stored charge (electrons) and discharge the capacitor. At the bright illumination levels found in projection displays, the devices could not hold the charge which had been read in long enough to address the mirrors, making them unusable in most practical display applications.

This problem was initially addressed by going to a 6T (six transistor) SRAM memory cell which acted as a flip-flop and latched the data in place until it was reset. These devices worked quite well in bright illumination environments, but they were more complicated to manufacture with the additional transistors and this led to yield and size problems at the chip level.

Figure 2A:
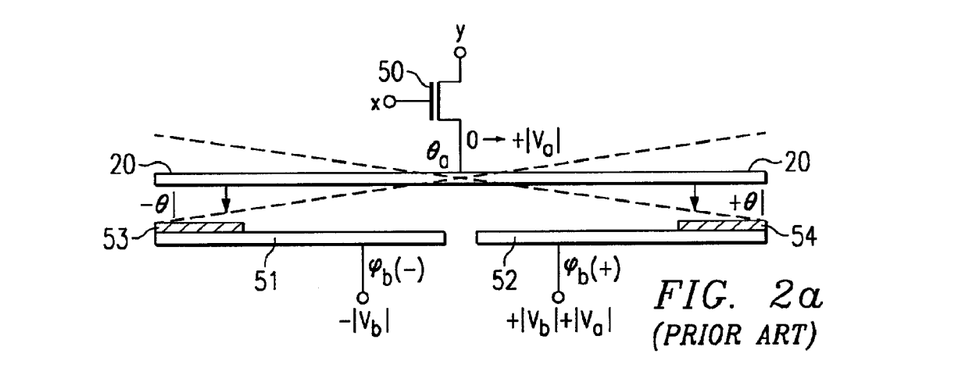
FIG. 2a is a schematic diagram of a one transistor one capacitor DRAM memory cell and micromirror element of the prior art.

In an attempt to get back to the simpler DRAM memory cell, the problems were addressed in two primary areas; (1) the number of transistors and (2) the charge retention problem. First, the problem relating to the number of transistors was addressed by the 1T (one transistor) driven beam approach shown in FIGS. 2a and 2b. In this case, the address signal $\phi_a$ is placed on the beam 20 rather than on the electrodes and is supplied by transistor 50. Then differential signals $\phi_{b(+)}$ and $\phi_{b(-)}$ are applied to electrodes 51 and 52, where:

$\phi_a = +|V_a|$, $\phi_{b(-)} = -|V_b|$ and $\phi_{b(+)} = +|V_b| + |V_a|$.

Landing electrodes 11 and 14 in the earlier 2T DRAM design are replaced by oxide (insulated) landing pads 53 and 54 in this case since the beam and landing sites are at different potentials. In a typical operation, the beam 20 waveform is $\phi_a = +|V_a|$, having magnitude of 5 volts from 0V to +5V. In order to achieve bi-directional operation the negative bias electrode 51 voltage is $\phi_{b(-)} = -|V_b| = -15V$ and the positive bias electrode 52 is $\phi_{b(+)} = +|V_b| + |V_a| = +20V$. When the beam 20 is addressed to 0V, there is a +15 volt potential difference between beam 20 and negative vias electrode 51 and a −20 volt potential difference between the beam 20 and positive bias electrode 52 (magnitudes only). Since the potential difference between the beam 20 and positive bias electrode 52 is 5 volts greater, this larger electric field will cause the beam 20 (mirror) to tilt 10° in the positive direction. Similarly, when the beam 20 is addressed to +5V there is a +20 volt potential difference between beam 20 and the negative bias electrode 51 and only a −15 volt difference between the beam 20 and positive bias electrode 52, so the beam will rotate −10°, in the negative direction.

Figure 2B:
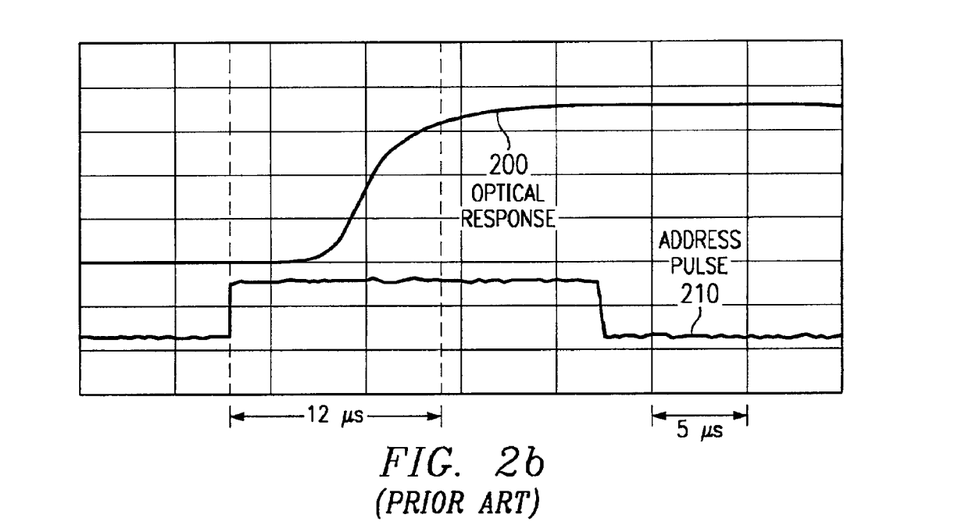

FIG. 2b shows the typical response for a bi-stable micromirror pixel which is digitally deflected between its quiescent state (0° deflection) and its tilted state (approximately ±10° deflection). As shown, 90% of the optical response 200 occurs within 12 μSec from the leading edge of the address pulse 210. In operation, it is necessary for the device to be loaded and the mirrors addressed multiple times during the 16.7 mSec frame time, depending on the number of digitized bits utilized. Therefore, when loading the most significant bit, it is necessary to hold the charge in the memory cell for approximately 8.4 msec. Both the 2T and 1T memory cell approaches are described in U.S. Pat. No. 5,142,405.

The charge retention problem has been addressed in a number of ways, one using a metal light shield that requires additional metal layers which negatively impact fabrication yield and cost of the micromirror chips. Another approach uses a guardring DRAM cell to help prevent recombination of photo-generated carriers. This technique is discussed below and in an earlier patent application Ser. No. 09/468,595.

Figure 3:
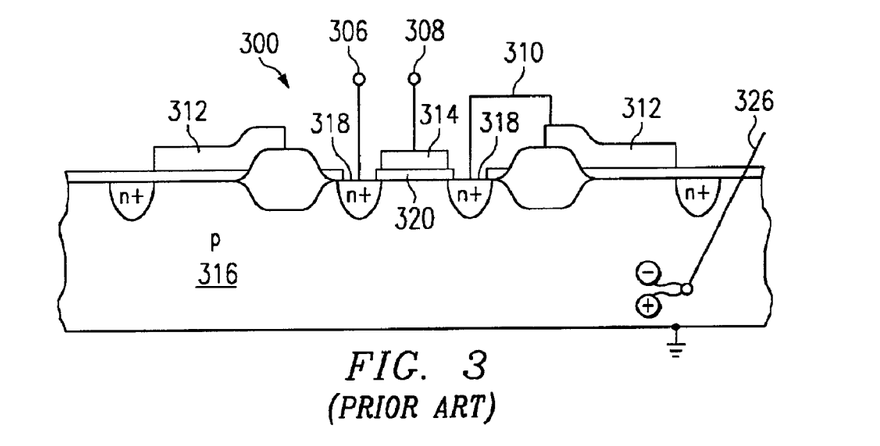
FIG. 3 is a cross-section side view of a memory cell illustrating the effect of photo-carrier recombination. (prior art)

FIG. 3, which shows a cross-section side view of a memory cell 300, illustrates the problem of photo-carrier recombination. Here the memory cell 300 is fabricated on a P-doped semiconductor (typically silicon) substrate 316. The upper plate 312 of the storage capacitor and the gate 314 of the transistor are formed with a deposited polycrystalline material. The gate of the transistor is connected to the write line 308. Vias 318 are opened through an oxide layer 320 to allow connection of the address line 306 to the source of the transistor and connection of the transistor drain to the polysilicon capacitor 312 to form address node 310.

In operation, photo-carriers (photo-generated electrical charges) are formed when photons 326 strike the semiconductor substrate. The energy of the photon 326 frees an electron from an atom to form an electron-hole pair which may drift or diffuse toward the address node 310 where it can recombine. If enough electrons reach the address node 310, the charge on the capacitor may not be sufficient to assure proper deflection of the micromirror mirror.

Figure 4A:
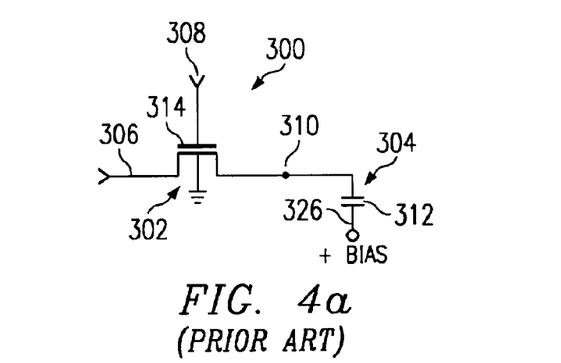
FIG. 4a is a schematic of a one transistor one capacitor DRAM memory cell with a n-well guardring with the lower plate of the capacitor connected to a positive bias. (prior art)

A solution to the photo-carrier recombination problem discussed above is to use an active collection region to form the bottom plate of the storage capacitor and act as a guardring that recombines photo-carriers before they reach the address node, located between the transistor and capacitor of the memory cell. FIG. 4a shows the guardring memory cell 300 comprising a transistor 302 (comprising a gate 314 connected to the write line 308 and an address line 306), an address node 310, and a capacitor 304 (comprising an upper plate 312 and an active lower plate or region 326 which is connected to a positive bias).

Figure 4B:
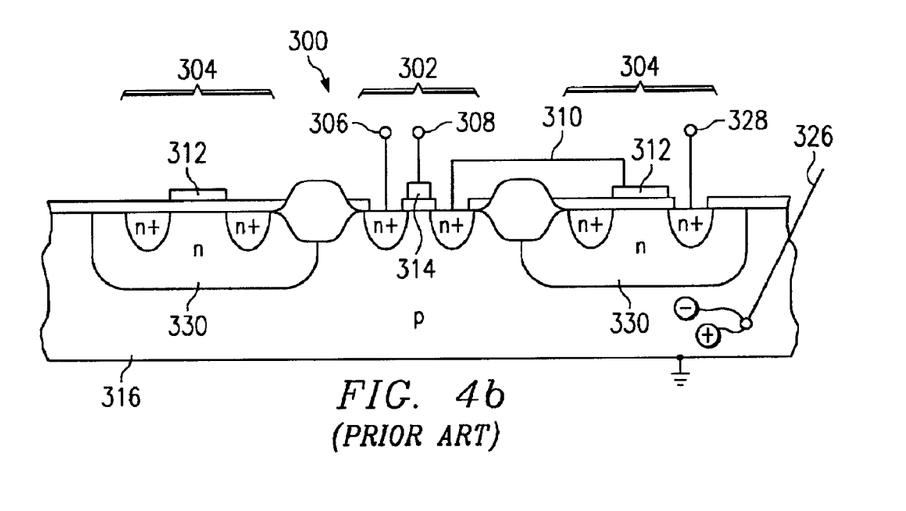
FIG. 4b is a cross-section side view showing the n-well guardring used to prevent photo recombination at the lower plate of the capacitor. (prior art)

FIG. 4b is a cross-section side view of the DRAM memory cell 300 of FIG. 3 with n-well guardring 330 added around the negative plate of the capacitor 304. This approach, comprised of transistor 302 and ring capacitor 304, effectively adds the n-well guardring 330 to the basic memory cell shown in FIG. 3. In this case, the lower plate of the capacitor 304 is positively biased by means of its connection 328 to a positive supply voltage. In operation, the n-well 330 serves to collect photo-generated electrons that migrate toward the address node 310 and are then swept towards the positive supply voltage, effectively protecting the charge stored on the capacitor 304. In this design, the n-well 330 is implanted into the p-doped substrate 316 to form the guardring around the lower plate of the capacitor 304.

What is needed is a simple one-transistor beam addressed memory cell that does not require the complications of an n-well capacitor. This invention provides this through the use of a polysilicon-to-substrate capacitor which is much less sensitive to photocarriers generated by illumination of the micromirror.

SUMMARY

To overcome the light susceptibility problem in earlier DRAM micromirror memory cells, charge is stored on a larger polysilicon-to-substrate capacitor which is not as susceptible to recombination of photo-generated carriers. Instead of storing the charge in the light sensitive depletion capacitance of the address node, most of the charge is stored on this larger polysilicon-to-substrate capacitor which is not sensitive to light. In addition, the address node is moved to the center of the micromirror mirror to obtain maximum shielding of light for the still present, but much smaller, light sensitive depletion portion of the cell. The combination of these two features; (1) adding a larger, parallel non light sensitive polysilicon-to-substrate storage capacitor, and (2) moving the smaller, less light sensitive portion of the cell farther away from the direct illumination, allows the micromirror to adequately hold the cell charge for greater than the 300 μSec micromirror load time.

This invention also provides improved micromirror performance in the following areas:

1. ensures that bad (failed) CMOS memory cells in the array are automatically forced to the more desirable dark state, which improves the yield of usable micromirrors, and
2. allows the use of phased reset, a method currently used on SRAM chips to improve the optical efficiency of the display system.

DESCRIPTION OF THE VIEWS OF THE DRAWINGS

The included drawings are as follows:

FIG. 2b is a plot of waveforms showing the electro-mechanical response time for the bistable micromirror of FIG. 2a.

FIG. 6b illustrates the shift in the flat band voltage illustrated in FIG. 6a.

FIG. 9b are the "reset" and "reset bar" waveforms for the one transistor one capacitor micromirror shown in FIG. 9a.

DETAILED DESCRIPTION

In the one transistor one capacitor memory cell architecture discussed in the prior art, the address node. is susceptible to recombination due to loading by photo-generated carriers when used in high brightness applications, such as a projection display. The charge needs to remain on the storage for the load time of the micromirror, which is at least 300 μSec. As a result, larger, less sensitive storage capacitors and better light immunity are important and are realized by means of this invention. The one transistor one capacitor memory architecture of this invention includes a one transistor NMOS passgate tied to a polysilicon-to-substrate capacitor that is properly doped with phosphorous to gain a symmetric capacitance across the operation voltage range of the device. This design adds the large polysilicon-to-substrate storage capacitor in parallel with the built-in substrate capacitor in the cell of the one transistor one capacitor CMOS DRAM, used as the underlying memory in bi-directional mirror addressed micromirrors. The charge on the poly capacitor is not susceptible to recombination since the charge is stored on the poly and the substrate is tied to ground, leaving only the smaller address node capacitance of the pass gate being susceptible to recombination of photo-generated carriers. As a result, this approach significantly diminishes the sensitivity to light for the single transistor, mirror addressed micromirror memory, allowing these higher yield, one transistor DRAM memory cells to be used in high brightness display applications.

Figure 5A:
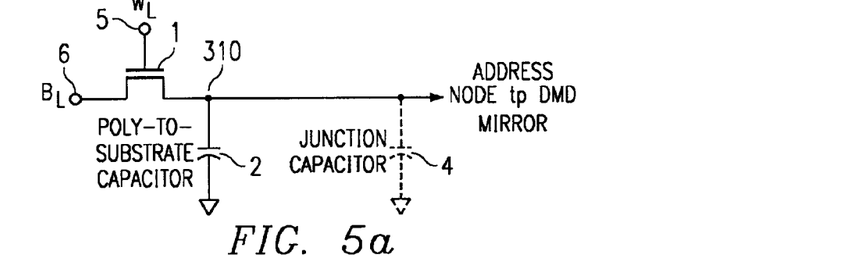
FIG. 5a is a schematic of the one transistor one capacitor DRAM cell of this invention with polysilicon-to-substrate capacitor.

FIG. 5a is a schematic of the basic DRAM memory cell of this invention. The cell is comprised of an NMOS transistor 1 and polysilicon-to-substrate capacitor 2. The node of the transistor's 1 source and positive side of capacitor 2 ties to the mirror address node 310. In addition, there is a much smaller inherent junction capacitor 4 which is effectively in parallel with the polysilicon-to-substrate capacitor 2. The gate 5 ($W_L$) and drain 6 ($B_L$) of transistor 1 are tied to the ROW and COLUMN address lines of the micromirror, respectively.

Figure 5B:
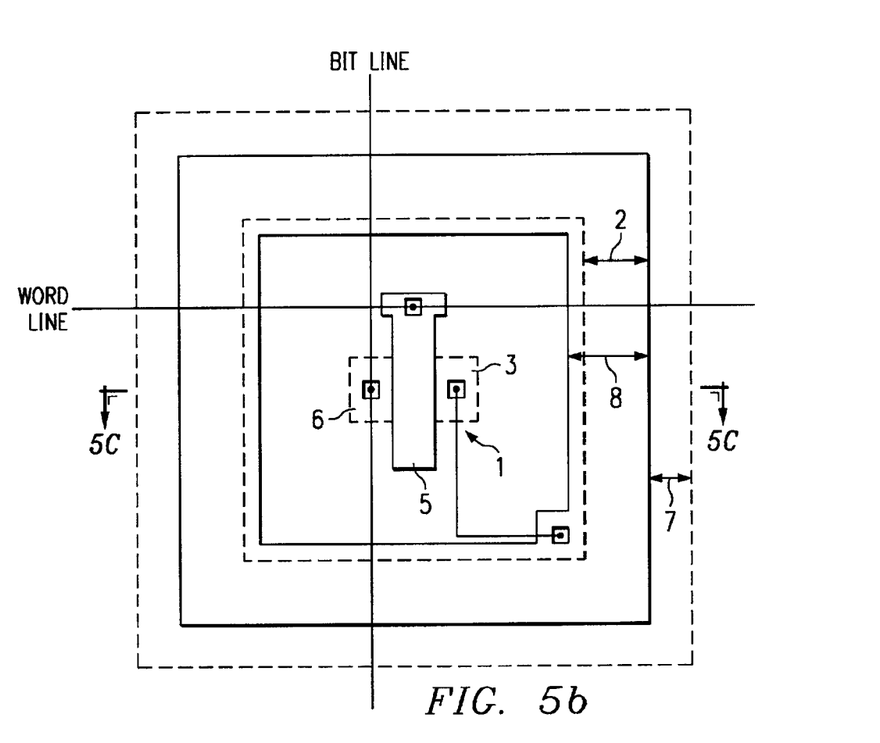
FIG. 5b is a plan view of a micromirror cell drawing illustrating the polysilicon-to-substrate capacitor wrapped around the address node and the location of the smaller capacitance, light sensitive address node located at the center of the cell for maximum light shielding.

Of significance to this invention is the fact that the storage capacitor is large enough to be able to properly hold the pixels charge until the micromirrors memory is read in or out of the array. This large capacitance is achieved by means of a polysilicon-to-substrate capacitor 2. FIG. 5b is a layout drawing of the memory cell showing the n-channel passgate transistor 1, comprising poly gate 5, source 3, and drain 6, and surrounded by the polysilicon-to-substrate capacitor 2 (same as capacitor 2 in FIG. 4a). By surrounding the n-channel transistor with this "donut" shaped poly capacitor, the capacitor size is maximized for the space under the micromirror mirror. The large capacitance area 2 is realized by the overlap of the N+ 7 and poly 8 layers. As observed in the layout, this approach provides the relatively large poly storage capacitance.

Figure 5C:
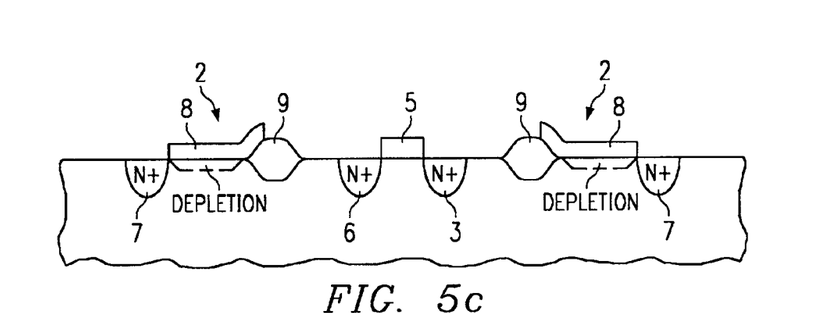
FIG. 5c shows a cross-section side view drawing for a one transistor one capacitor memory cell according to one embodiment of this invention.

FIG. 5c is a semiconductor plan drawing showing a cross section A–A' through the memory cell of FIG. 5b. As shown, a field oxide layer 9 is used between the metal 1 and metal 2 layers of the device, in a standard fashion, to insulate between the two metal layers. This solution has much less metal density, however, than previous micromirror DRAM memory cell designs in both the metal 1 and metal 2 layers, so the potential for shorts between metal layers is reduced. The "donut" shaped poly capacitor 2 is shown with a depletion area beneath it.

This architecture also uses an increased voltage at the gate of the n-channel transistor 1 to eliminate the VT loss across the channel and enable a full bit-line voltage to pass to the capacitor. The $W_L$ voltage is typically 0 to 7.5 volts in order to allow a full 5 volt bit-line voltage to be applied to the capacitor. The capacitor must be doped with P-type underneath to make a depletion region at 0 volts, as mentioned above, and create a symmetric capacitance from 0 to +5 volts.

Figure 6A:
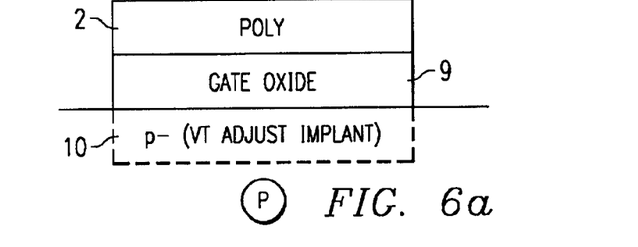
FIG. 6a shows a boron implant in the memory cell used to shift the flat band voltage to provide asymmetric capacitance over a 0 to +5V range.

FIG. 6a illustrates the semiconductor processing involved in the area that makes up the polysilicon-to-substrate capacitor. This includes the poly layer 2, the gate oxide insulating layer 9, and the VT adjust implant 10 under the capacitor. Such an adjustment can be accomplished by any number of approaches, such as a boron implant.

Figure 6B:
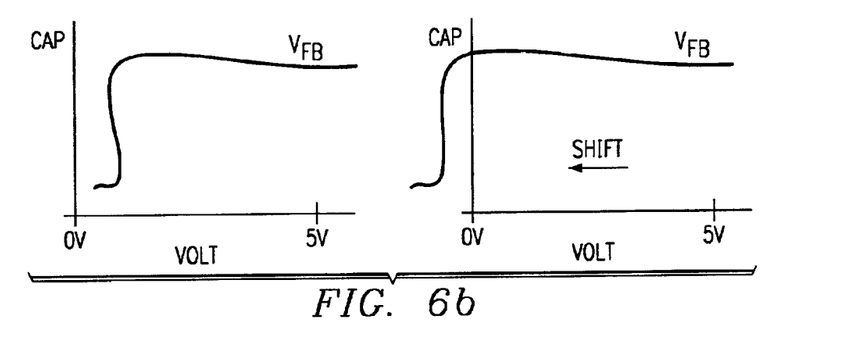

FIG. 6b shows the results of the VT adjust implant discussed above. This illustrates how the usual voltage-capacitance waveform (top graph) is shifted to the left (bottom graph) to provide a uniform capacitance across the desired operating voltage range from 0 to +5 volts.

Figure 7A:
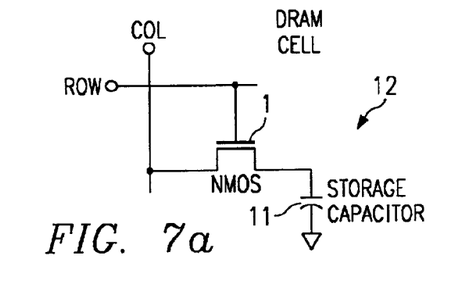
FIG. 7a is a schematic of a novel one transistor one capacitor DRAM cell with polysilicon-to-substrate capacitor showing address lines as used in the mirror addressed micromirror application.

In previous attempts to use a DRAM micromirror memory cell, the storage capacitor has consisted of only the cell substrate depletion capacitance 4, which is very sensitive to the exposed light on the micromirror. As mentioned earlier, this invention uses a polysilicon-to-substrate capacitor, which is not sensitive to light, as the primary storage element in the micromirror memory. FIG. 7a shows again the DRAM cell 12 with NMOS transistor 1 and storage capacitor 11, which is the combined capacitance of depletion capacitor 4 and polysilicon-to-substrate capacitor 2. Also shown are the column and row connections for connecting the cell into a memory array.

Figure 7B:
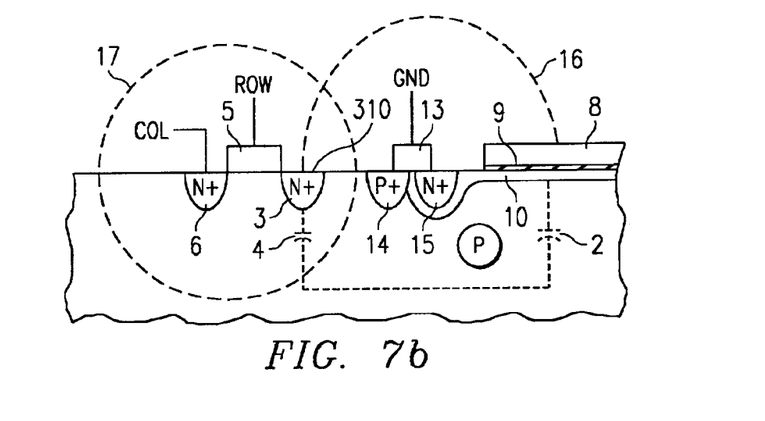
FIG. 7b is a cross-section side view of the one transistor one capacitor DRAM memory cell of this invention emphasizing the large difference in the capacitance of the effective parallel light sensitive, small node capacitor and the light immune, large polysilicon-to-substrate capacitor.

FIG. 7b shows the cell with junction depletion capacitance 4 and the much larger polysilicon-to-substrate capacitance 2 tied together (illustrated by dotted line 16) to.form the address node 310. This connection is made between the source of pass gate transistor 17, made up of gate 5, drain 6, and source 3, and the poly layer 8 of the polysilicon-to-substrate capacitor 2. The poly layer 8 has an insulating gate oxide layer 9 and a doped depletion area layer 10 underneath the capacitor, as shown. An N+ diffusion 15 and P+ diffusion 14, along with a grounded gate 13 are used to connect both the depletion region under the poly capacitor and the substrate, to ground.

Figure 7C:
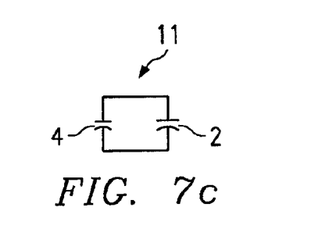
FIG. 7c is a schematic showing the small light sensitive capacitor in parallel with the larger light immune polysilicon-to-silicon storage capacitor.

As shown in FIG. 7c, the storage capacitor 11 in the new memory cell of this invention consists of the inherent light sensitive junction capacitor 4 in parallel with the much larger light insensitive polysilicon-to-substrate capacitor 2. As a result, by using this large light immune polysilicon-to-substrate capacitor 2 along with shielding the smaller light sensitive substrate capacitor 4, this memory cell can effectively hold the charge for at least 300 μSec.

The smaller light sensitive junction depletion capacitance on the address node of the pass gate is still susceptible to recombination of photo-generated carriers and needs to have maximum light shielding. Since the substrate is tied to ground for the cell, this limits the address node of the pass gate as the only portion of the cell that is susceptible to recombination of photogenerated carriers.

Figure 8A:
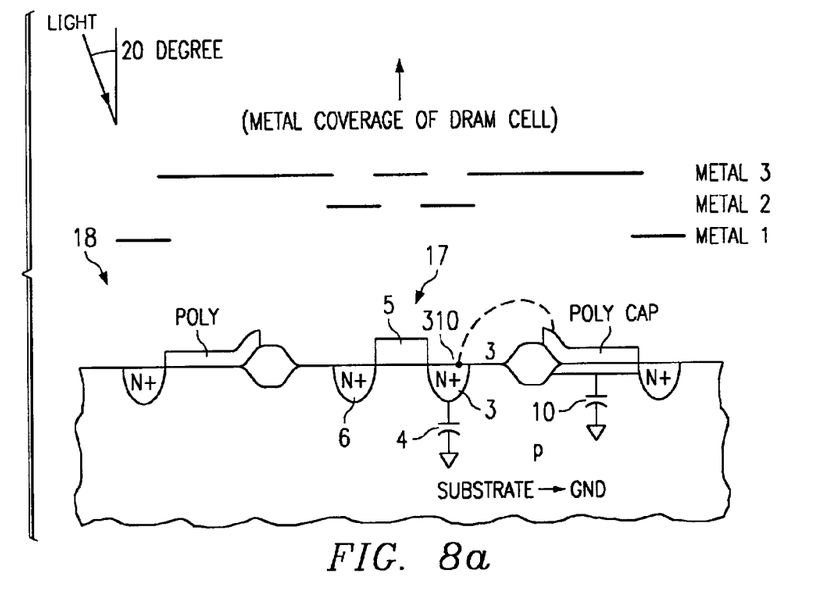
FIG. 8a is a schematic diagram of the memory cell of this invention illustrating the metal shielding over the light sensitive address node.

As illustrated in FIG. 8a, the one transistor memory cell 18 of this invention achieves the desired effect of protecting the address node of the pass gate. This diagram shows the memory cell 18 and the address node 310, at the connection of the smaller light sensitive junction capacitor 4 and the much larger poly capacitor 10. The goal is to provide maximum light shielding at the mirror address node 310 located in the area of the pass gate transistor 17, comprised of gate 5, drain 6, and source 3. The metal of the mirror, above the address node, is used to block any normal incident ray path to the silicon, where the suspect carriers are generated. Although the node for earlier one transistor one capacitor cells has been located near the center of the mirror as well, the layout of the cell of this invention provides 100% metal shielding over the cell. By using metal 3, metal 2, and metal 1 as light shields, all paths of normal incident light are blocked. Using this scheme, any incoming photons will have to be reflected, diffracted, or scattered to reach the silicon substrate and generate photo-carriers. Therefore, any incoming light reaching the silicon will be attenuated by the metallization, decreasing the photon flux reaching the silicon.

Figure 8B:
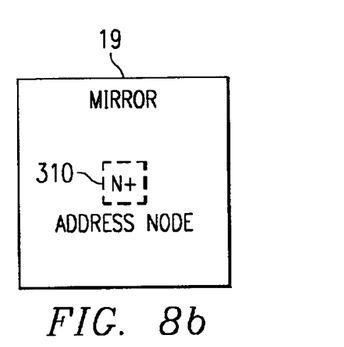
FIG. 8b is a plan view illustrating the location of the light sensitive address node at the center of the one transistor one capacitor DRAM memory cell.

Also, by moving this circuitry to the center of the micromirror mirror, the address node 310 is away from any direct illumination. FIG. 8b shows how the pass gate transistor and address node 310 is located near the center of the memory cell to provide maximum light shielding by the metal rotating mirror 19 of the micromirror. This coupled with the 100% metal coverage, discussed above, assures maximum light immunity. And any light that may get in the cell must bounce off the metal layers several times before reaching the address node 310 of the pass gate transistor 17.

Figure 9A:
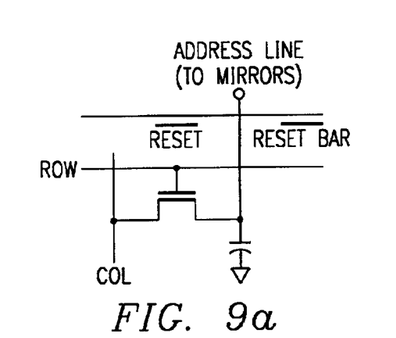
FIG. 9a is a diagram showing the mirror and reset electrodes of the one transistor one capacitor micromirror of this invention.

FIG. 9 illustrates the operation of the one transistor one capacitor micromirror of this invention. FIG. 9a is a diagram of the cell of this invention as used in a memory array with row and column address lines and showing the "reset" and "reset bar" address electrodes, which are located underneath and on either side of the mirror.

Figure 9B:
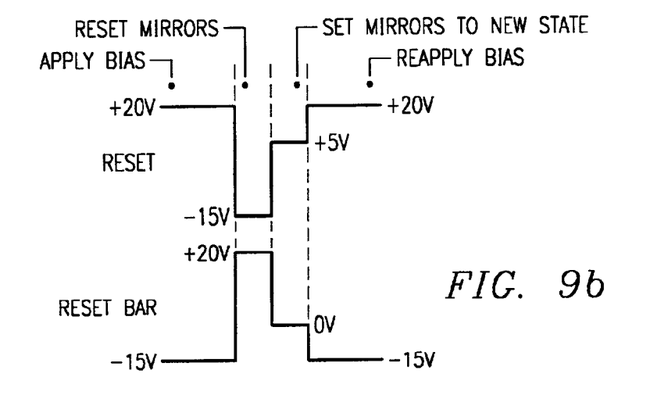
Figure 9C:
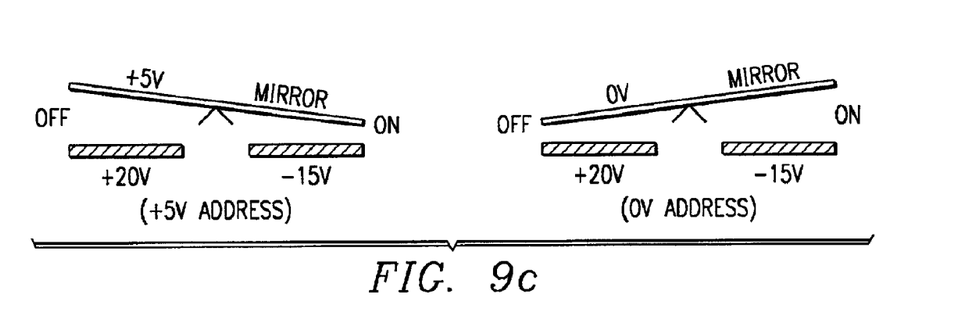
FIG. 9c illustrates the mirror rotation for the "ON" and "OFF" states for one transistor one capacitor micromirror of this invention.

FIGS. 9b and 9c shows the "reset" and "reset bar" waveforms and mirror tilt configuration, respectively, for the memory cell of FIG. 9a. FIG. 9b shows the sequence for resetting the mirrors and setting them to their new state. This is shown in four time intervals; (1) apply bias, (2) reset pulse, (3) set mirrors to new state, and (4) reapply bias. During the steady-state time when bias is applied, the reset electrode is set at +20 volts and the reset bar electrode is set at −15 volts. During the reset pulse time, when potential energy is stored by the mirror spring tips, the reset electrode is set at −15 volts and the reset bar is set at +20 volts, which is a swing of 35 volts for each electrode. During the mirror set time period, when the potential energy is released, the reset electrode is set to +5 volts and the reset bar electrode is set to 0 volts. During this mirror set period, those mirrors with a +5 volt address field will stay (not rotate), while those with a 0 volt address will crossover (rotate) to a new state.

As shown in FIG. 9c, when +5 volts is applied to the mirror, the mirror tends to tilt towards the −15V electrode since the magnitude of the voltage differential is 20 volts on that side compared to only 15 Volts on the +20V electrode side. In a like manner, when 0 volts is applied to the mirror, the mirror tilts towards the +20V side since the magnitude of the voltage is 20 volts on that side as compared to only 15V on the −15V side. For 0V mirror address, the mirror is defined to be in the OFF state and for +5V mirror address the mirror is defined to be in the ON state.

The cell of this invention is implemented to enable the one transistor one capacitor DRAM memory cell to utilize an addressing method known as phased reset, which is used in six transistor SRAM memory cells to increase the optical efficiency of the display system. The disclosed addressing method enables the mirrors to easily be addressed by horizontal rather than diagonal rows, simplifying the loading and resetting sequences.

Figure 10A:
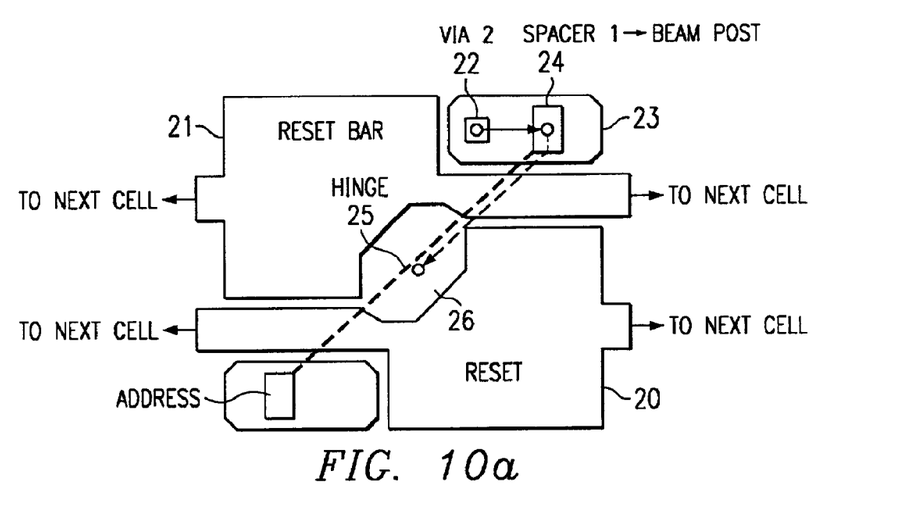
FIG. 10a is a plan view of the electrode metalization layer of the one transistor one capacitor memory cell of this invention with an inverted column address signal ($B_L$) which allows ground to be routed through the array so that any CMOS pixel failures will fail to the "dark" side.
Figure 10B:
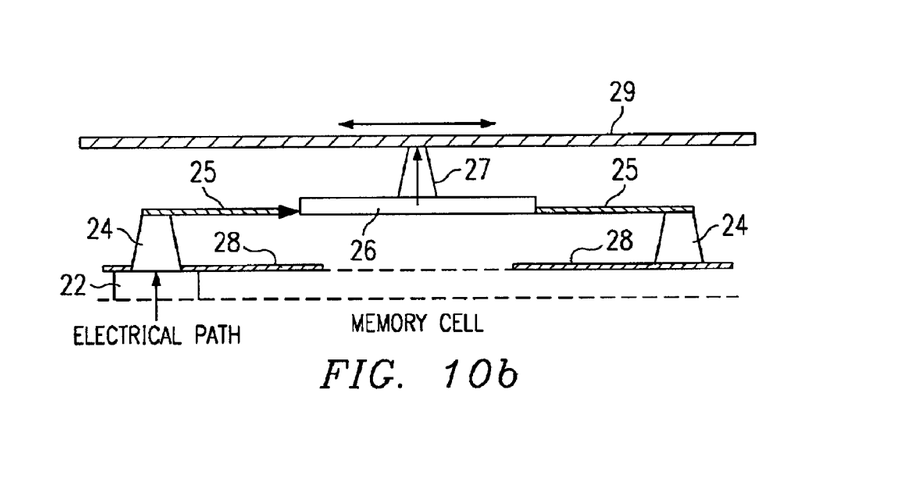
FIG. 10b is a side view according to one embodiment of the present invention showing the vertical build-up and routing of the mirror address signal.

Earlier devices routed the "reset" and "reset bar" signals diagonally through the array at the metal 3 level. In this invention, the "reset" and "reset bar" signals are routed horizontally through the array at the metal 3 level 28, as shown in FIG. 10. In FIG. 10a, the "reset" 20 and "reset bar" 21 signals connect cell-to-cell horizontally, simplifying the loading and resetting sequences. FIGS. 10a and 10b illustrate how the electrical connection from the address node at metal 3 to the mirror is made; up through the oxide layer by way of via 2 22 to the bottom of the beam post 24, up through spacer 1 by means of the beam post 24, across the hinge 25 to the yoke 26, up through spacer 2 by means of the mirror post 27, to the mirror 29. An oxide layer is also added on top of the level 3 landing pads to provide isolation between the mirror and the reset signals.

Figures 11A, 11B, 11C, 11D:
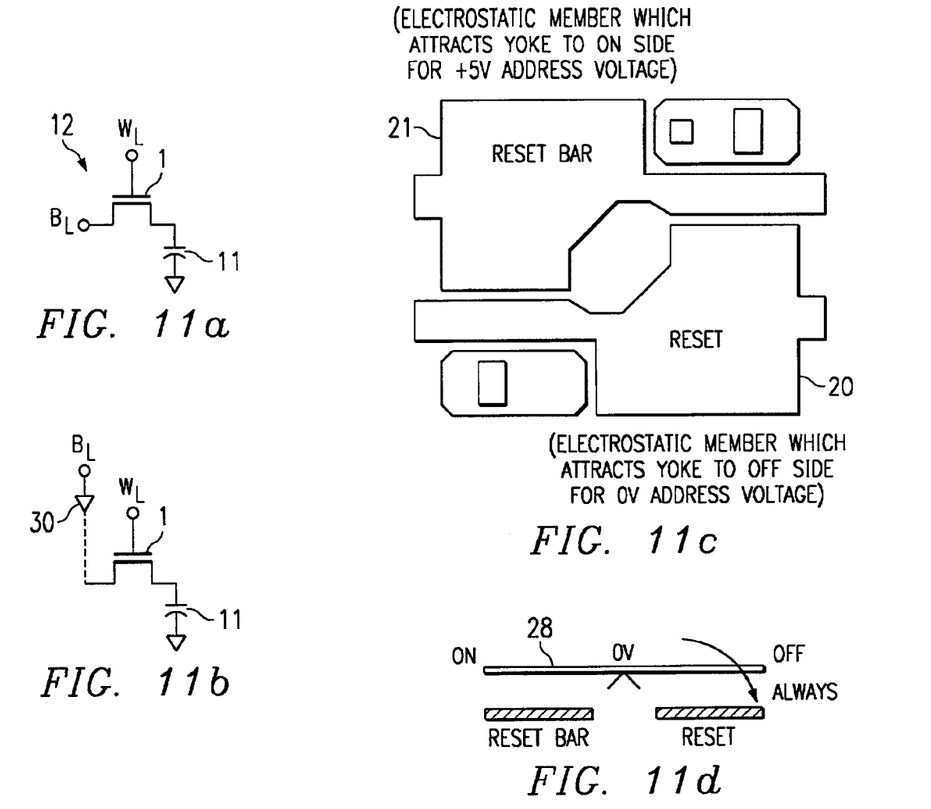
FIG. 11a is a schematic view of the one transistor one capacitor memory cell according to one embodiment of this invention with the bottom plate of the storage capacitor connected to ground.
FIG. 11b is a schematic view of the one transistor one capacitor memory cell of FIG. 11a showing an inverter at the column address line.
FIG. 11c is a schematic view illustrating how the mirror always goes to the OFF state, in the micromirror of this invention, when a CMOS DRAM cell failure occurs.

Another feature this invention, is that it allows a one transistor one capacitor memory cell to be implemented such that all CMOS circuit failures (fails) in the array can be forced to the dark state. Although no bright fails are allowed in most micromirror projector applications, a certain number of dark fails are acceptable, depending on the particular application. This is due to the fact that when a micromirror mirror fails in the ON (bright) state it appears much worse to the eye when projected on to a screen than when it fails in the OFF (dark) state. Thus, forcing all CMOS circuit failures to dark failures benefits the micromirror yield by allowing more of the devices in a lot to be usable in various projector applications. This feature does not help with physical mirrors which may fail in the ON (bright) state due to a mechanical failure independent of the memory cell. As shown in FIG. 11a, in the memory cell 12 of this invention, only ground is routed through the array. Then the "reset" and "reset bar" signals are routed horizontally and oriented so as to turn OFF the mirror with a binary 0 (0V) address voltage. In earlier micromirrors, a binary 1 (+5V) turns the mirror OFF and a binary 0 turns it ON. To accomplish turning the mirror OFF with a binary 0, the data going into the array is inverted, internal to the chip with inverter 30 shown in FIG. 11b. FIG. 11c shows a sketch of the memory cell again, illustrating the relationship of the "reset" and "reset bar" electrodes 20 and 21, respectively, to the mirror beam address voltage. FIG. 11d illustrates how the mirror address voltage is always 0 volts for a failure in the CMOS array, forcing the mirror 28 to the OFF state.

In earlier micromirrors, attempts to correct failed pixels involved such things as slaving mirrors together or laser/fuse correction. But the benefits of the architecture of this invention inherently assures that CMOS cell failures, whether from gate oxide breakdown or other cause, are projected as dark pixels.

Micromirror projection displays will benefit from the improvements in the one transistor one capacitor architecture of this invention; namely in the areas of higher performance, improved reliability, and lower cost. This is a result of the ability to hold a charge on the polysilicon-to-substrate capacitor for a longer time making it possible to use a higher yield DRAM memory cell, the improved light immunity offered by the 100% metal 3 coverage of the address node, the improved split reset offered by the horizontal routing of the "reset" and "reset bar" signals, and the automatic dark mirror response to any CMOS failures.

Figure 12A:
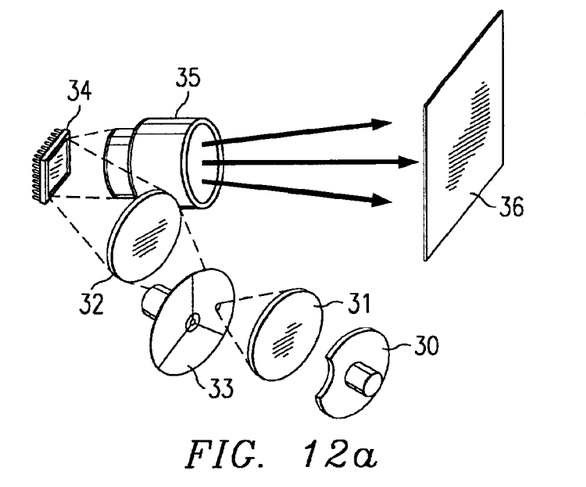
FIG. 12a is a schematic view of a digital projection display using a single one transistor one capacitor micromirror spatial light modulator according to the present invention.

Two embodiments of projectors which will benefit from the use of the one transistor one capacitor micromirror of this invention are shown in FIG. 12. FIG. 12a is a block diagram of a single micromirror embodiment, comprised of a light source 30, first and second condenser optics 31 and 32, a rotating color wheel and motor 33, the micromirror 34 of this invention, a projection lens 35, and a projection screen 36. The projector of FIG. 12a operates the micromirror in the color field sequential mode, whereby red-green-blue light is sequentially generated from a white light source 31, by means of the color filter segmented rotating wheel 33. The red, green, and blue light strikes the surface of the micromirror 34. This configuration operates the micromirror 34 at high speeds, 5.6 mSec per color field, in order to sequentially read in the three (red, green, and blue) fields in a single TV field time of 16.7 mSec. Projectors of this type are typically used in medium brightness applications, such as in conference rooms and home theaters.

Figure 12B:
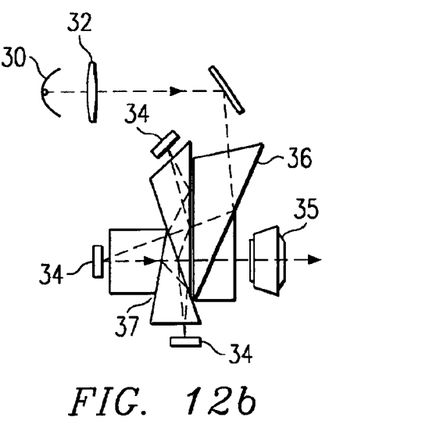
FIG. 12b is a schematic view for a high brightness digital projector display which uses three of the one transistor one capacitor micromirror spatial light modulators of this invention.

FIG. 12b shows a second embodiment of a 3-micromirror projector utilizing the one transistor one capacitor micromirror of this invention. This implementation uses three of the micromirrors 34, one for each of the red, green, and blue primary colors. In this case, the field time is 16.7 mSec, which is a long time for the micromirror to hold the charge in the cell. The projector of this embodiment is comprised of a white light source/reflector 30, a condenser lens 32, a total internal reflective (TIR) prism 36, a color splitting/combining prism 37, three micromirrors 34 of this invention, a projection lens 35, and a projection screen (not shown). Projectors of this type are typically used in higher brightness applications, such as in large convention centers and cinema theaters.

While the invention has been described in the context of two preferred embodiments, it will be apparent to those skilled in the art that the present invention may be modified in numerous ways and may assume other embodiments other that that specifically set out and described above. Accordingly, it is intended by the appended claims to cover all modifications of the invention which fall within the true spirit and scope of the invention.

What is claimed is:

1. A micromirror device comprising:
   a memory cell with a polysilicon-to-substrate storage capacitor, said memory cell comprising:
      a single CMOS transistor having an inherent junction capacitor and electrically connected to said polysilicon-to-substrate storage capacitor;
      a bit-line providing data to said memory cell;
      a word address line; and
      a mirror address node connected to an output of said memory cell;
   a mirror superstructure electrically connected to said memory cell; and
   reset electrodes positioned by said mirror superstructure.

2. The micromirror device of claim 1, wherein said polysilicon-to-substrate capacitor encircles said mirror address node.

3. The micromirror device of claim 1, wherein the area of said polysilicon-to-substrate capacitor takes up the majority of an area of said mirror superstructure.

4. The micromirror device of claim 1, wherein a majority of a stored charge is stored on said polysilicon-to-substrate capacitor.

5. The micromirror device of claim 1, wherein said polysilicon-to-substrate capacitor electrically is in parallel with said inherent junction capacitor.

6. The micromirror device of claim 1, wherein an implant is applied to provide a flat band voltage operating range from 0 to +5 volts for said polysilicon-to-substrate capacitor.

7. The micromirror device of claim 1, wherein a signal to the bit address line is inverted.

8. The micromirror device of claim 1, wherein said mirror address node is located at a center of said memory cell.

9. The micromirror device of claim 1 further comprising an array of said memory/mirror cells.

10. The micromirror device of claim 1 further comprising additional light shielding over said mirror address node.

11. A micromirror device comprising:
    a memory cell with a polysilicon-to-substrate storage capacitor;
    a mirror superstructure electrically connected to said memory cell; and
    an address layer comprising reset electrodes positioned by said mirror superstructure;
    an oxide layer;
    a hinge and yoke layer above said metal layer;
    a mirror metal layer above said hinge and yoke layer; and
    wherein said reset electrodes are formed on said oxide layer; said reset electrodes comprising a "reset" and "reset bar" electrode, wherein:
       said "reset" and "reset bar" electrode steady state values are set at +20 and −15 volts, respectively;
       said "reset" and "reset bar" electrodes are switched to −15V and +20 volts, respectively, to reset the micromirror mirrors;
       said "reset" and "reset bar" electrodes are switched to +5 volts and 0 volts, respectively, to set said mirrors to their new state;
       the mirror is addressed at 0 volts to rotate said mirror −10° OFF, and
       said mirror is addressed at +5 volts to rotate said mirror +10° ON.

12. The micromirror device of claim 11 wherein said address metal layer extends over an address node.

13. The micromirror device of claim 11, wherein said "reset" and "reset bar" electrodes are horizontally connected across said array to enable phase reset mode of operation.

14. The micromirror device of claim 11, wherein an address node is connected to said mirror by means of a hinge post, said hinge, said yoke, and a mirror post.

15. The micromirror device of claim 11, wherein said mirror over failed CMOS cell always turns OFF.

* * * * *